United States Patent
Gu et al.

(10) Patent No.: US 9,824,659 B2
(45) Date of Patent: Nov. 21, 2017

(54) SHIFT REGISTER, GATE DRIVING CIRCUIT AND DISPLAY APPARATUS

(71) Applicants: BOE Technology Group Co., Ltd., Beijing (CN); Hefei BOE Optoelectronics Technology Co., Ltd., Hefei (CN)

(72) Inventors: Honggang Gu, Beijing (CN); Chuncheng Che, Beijing (CN); Xiaohe Li, Beijing (CN); Xianjie Shao, Beijing (CN); Jie Song, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/327,852

(22) PCT Filed: Mar. 24, 2016

(86) PCT No.: PCT/CN2016/077226
§ 371 (c)(1),
(2) Date: Jan. 20, 2017

(87) PCT Pub. No.: WO2017/036121
PCT Pub. Date: Mar. 9, 2017

(65) Prior Publication Data
US 2017/0221441 A1 Aug. 3, 2017

(30) Foreign Application Priority Data
Sep. 1, 2015 (CN) .......................... 2015 1 0551670

(51) Int. Cl.
*G11C 19/00* (2006.01)
*G09G 3/36* (2006.01)
(Continued)

(52) U.S. Cl.
CPC ........... *G09G 3/3677* (2013.01); *G06F 3/041* (2013.01); *G11C 19/28* (2013.01);
(Continued)

(58) Field of Classification Search
None
See application file for complete search history.

(56) References Cited

U.S. PATENT DOCUMENTS

2008/0101529 A1* 5/2008 Tobita .................. G09G 3/3677
377/64
2008/0219401 A1* 9/2008 Tobita .................. G09G 3/3677
377/79
(Continued)

FOREIGN PATENT DOCUMENTS

CN 103996370 A 8/2014
CN 104021769 A 9/2014
(Continued)

OTHER PUBLICATIONS

Jun. 29, 2016—International Search Report and Written Opinion Appn PCT/CN2016/077226 with Eng Tran.
(Continued)

*Primary Examiner* — Tuan T Lam
(74) *Attorney, Agent, or Firm* — Banner & Witcoff, Ltd.

(57) ABSTRACT

A shift register, a gate driving circuit and a display apparatus are provided. The shift register comprises a pull-up node control unit, a pull-down node control unit, a pull-up output unit, a noise reduction unit, and a touch scanning control unit. Herein, the pull-up node control unit is connected to a first input terminal, a second input terminal, a first power supply terminal, a second power supply terminal, and a pull-up node (PU); the pull-down node control unit is connected to a high level terminal (VGH), a low level terminal (VGL) and the pull-up node (PU) and a pull-down
(Continued)

node (PD); the pull-up output unit is connected to a clock signal input terminal (CLK), the pull-up node (PU), a signal output terminal (Output); the noise reduction unit is connected to the pull-up node (PD) and the low level terminal (VGL); the touch scanning control unit is connected to a control signal input terminal (SW), the pull-up node (PU), the signal output terminal (Output), and the low level terminal (VGL).

20 Claims, 5 Drawing Sheets

(51) Int. Cl.
*G06F 3/041* (2006.01)
*G11C 19/28* (2006.01)
(52) U.S. Cl.
CPC ............... *G09G 2300/0809* (2013.01); *G09G 2310/0286* (2013.01); *G09G 2310/061* (2013.01)

(56) References Cited

U.S. PATENT DOCUMENTS

| | | | |
|---|---|---|---|
| 2011/0096027 A1 | 4/2011 | Jeon et al. | |
| 2012/0269316 A1* | 10/2012 | Jang | G09G 3/3677 377/75 |
| 2014/0044228 A1* | 2/2014 | Jang | G11C 19/00 377/64 |
| 2015/0346904 A1* | 12/2015 | Long | G09G 3/3677 345/174 |
| 2016/0246418 A1* | 8/2016 | Wang | G11C 19/28 |
| 2016/0266699 A1* | 9/2016 | Zhao | G09G 3/3677 |
| 2016/0274713 A1* | 9/2016 | Zhang | G06F 3/041 |
| 2016/0365061 A1* | 12/2016 | Hong | G11C 19/28 |
| 2016/0372069 A1* | 12/2016 | Lv | G09G 3/36 |
| 2017/0010731 A1* | 1/2017 | Zhang | G11C 19/28 |
| 2017/0102801 A1* | 4/2017 | Ko | G06F 3/044 |
| 2017/0102814 A1* | 4/2017 | Xu | G06F 3/0416 |
| 2017/0108989 A1* | 4/2017 | Gu | G06F 3/0418 |
| 2017/0123539 A1* | 5/2017 | Wang | G06F 3/0412 |
| 2017/0123556 A1* | 5/2017 | Lin | G06F 3/0416 |

FOREIGN PATENT DOCUMENTS

| | | |
|---|---|---|
| CN | 104036738 A | 9/2014 |
| CN | 104078017 A | 10/2014 |
| CN | 104240766 A | 12/2014 |
| CN | 104795041 A | 7/2015 |
| CN | 105047168 A | 11/2015 |
| JP | 2006024350 A | 1/2006 |

OTHER PUBLICATIONS

Jan. 3, 2017—(CN) First Office Action 201510551670.7 with Eng Tran.
Jun. 13, 2017—(CN) Second Office Action Appn 201510551670.7 with English Tran.

* cited by examiner

US 9,824,659 B2

SHIFT REGISTER, GATE DRIVING CIRCUIT AND DISPLAY APPARATUS

The application is a U.S. National Phase Entry of International Application No. PCT/CN2016/077226 filed on Mar. 24, 2016, designating the United States of America and claiming priority to Chinese Patent Application No. 201510551670.7 filed Sep. 1, 2015. The present application claims priority to and the benefit of the above-identified applications and the above-identified applications are incorporated by reference herein in their entirety.

TECHNICAL FIELD

The present disclosure relates to a field of display technique, in particular to a shift register, a gate driving circuit and a display apparatus.

BACKGROUND

A basic principle of realizing display of one frame picture by a thin film transistor-liquid crystal display (TFT-LCD) is as follows: inputting, by a gate driving circuit, a square wave with certain width to each row of pixels from top to down sequentially so as to gate this row of pixels; and then, outputting, by a source driving circuit, a required signal to each pixel of respective rows of gated pixels. In the existing display apparatus, the gate driving circuit is designed with a gate drive on array (GOA) circuit, which not only saves the cost but also realizes artistic design with two sides of the panel symmetrical, and at the same time can omit bonding area and peripheral wiring space of the gate driving circuit, so that the design of narrow frame of the display apparatus is realized, and productivity and yield rate of the display apparatus are raised.

At present, many types of input devices may be applicable to execute an operation in a computer system, such as a mouse, a button, a touch panel, an operating lever, a touch panel, etc. Due to usability, multi-functionality of operations, decreasing prices and stably rising yield rate of touch panels, they are becoming popular increasingly. The touch panel can be divided into out-cell and in-cell. An out-cell touch screen locates a panel having a touch function in front of a display, and a touch surface of this panel covers a visible area of the display, so as to realize touching and controlling. An in-cell touch screen integrates the touch function on the display panel, outside of which is coated with or without cover glass, and an operation can be implemented through touching the screen by a user's fingers.

In general, the GOA circuit comprises a plurality of shift registers connected in cascades. Compared with a display panel having no touch function, the touch screen needs to have both display function and touch function. Therefore, it is desirable that the shift registers in the GOA circuit of the touch screen are capable of being used to realize the display function and the touch function synchronously. However, in the existing shift register used for the GOA circuit of the touch screen, mutual interference exists between a display control signal and a touch control signal, such that adverse effect on the quality of display and touch would be caused respectively. In addition, an operation mode of the existing GOA circuit used for the touch screen is single, and has poor flexibility.

SUMMARY

A technical problem to be solved in embodiments of the present disclosure includes: to provide a shift register, a gate driving circuit and a display apparatus which are compatible with various functions with respect to the existing problems of the shift register.

In one embodiment, a technical solution adopted to solve the technical problem of the present disclosure is as follows: a shift register, comprising a pull-up node control unit, a pull-down node control unit, a pull-up output unit, a noise reduction unit, a touch scanning control unit. Herein, the pull-up node control unit is connected to a first input terminal, a second input terminal, a first power supply terminal, a second power supply terminal, and a pull-up node, and is configured to control a potential of the pull-up node according to a control signal input by the first input terminal and the second input terminal; the pull-up node is a connection node between the pull-up node control unit and the pull-up output unit. The pull-down node control unit is connected to a high level terminal, a low level terminal and the pull-up node and a pull-down node, and is configured to control a potential of the pull-down node according to the potential of the pull-up node; the pull-down node is a connection node between the pull-down node control unit and the noise reduction unit. The pull-up output unit is connected to a clock signal input terminal, the pull-up node, a signal output terminal, and is configured to control a potential of the signal output terminal according to the potential of the pull-up node and a clock signal input by the clock signal input terminal. The noise reduction unit is connected to the pull-up node, the pull-down node, the low level terminal and the signal output terminal, and is configured to reduce noise for the pull-up node and the signal output terminal through a signal input by the low level terminal under the control of the pull-down node. The touch scanning control unit is connected to a control signal input terminal, the pull-up node, the signal output terminal, and the low level terminal, and is configured to control an operation time in a touch scanning phase and potentials of the pull-up node and the signal output terminal according to the signal input by the control signal input terminal.

Alternatively, the touch scanning control unit can make the touch scanning phase occur between display phases of two adjacent frame pictures.

Alternatively, the touch scanning control unit can make the touch scanning phase occur in a display phase of each frame picture under the control of the signal input by the control signal input terminal.

Alternatively, the pull-up node control unit can comprise: a first transistor and a second transistor. Herein, a first electrode of the first transistor is connected to a first power supply terminal, a second electrode thereof is connected to the pull-up node, and a control electrode thereof is connected to the first input terminal; a first electrode of the second transistor is connected to the pull-up node, and a second electrode thereof is connected to the second power supply terminal, and a control electrode thereof is connected to the second input terminal.

Alternatively, the first power supply terminal can be a high voltage power supply terminal, and the second power supply terminal can be a low voltage power supply terminal; the signal input by the first input terminal can be a signal output by a signal output terminal of a previous stage of shift register of the shift register, and the signal input by the second input terminal can be a signal output by a signal output terminal of a next stage of shift register of the shift register, such that the shift register realizes displaying and scanning forwards.

Alternatively, the first power supply terminal can be a high voltage power supply terminal, and the second power supply terminal can be a low voltage power supply terminal; the signal input by the first input terminal can be a signal output by a signal output terminal of the next stage of shift register of the shift register, and the signal input by the second input terminal can be a signal output by a signal output terminal of the previous stage of shift register of the shift register; or, the first power supply terminal can be a low voltage power supply terminal, and the second power supply terminal can be a high voltage power supply terminal; the signal input by the first input terminal can be a signal output by a signal output terminal of the previous stage of shift register of the shift register, and the signal input by the second input terminal can be a signal output by a signal output terminal of the next stage of shift register of the shift register, such that the shift register realizes displaying and scanning backwards.

Alternatively, the pull-up output unit can comprise: a third transistor and a storage capacitor. Herein, a first electrode of the third transistor is connected to the clock signal input terminal, a second electrode thereof is connected to a signal output terminal, and a control electrode thereof is connected to the pull-up node; a first terminal of the storage capacitor is connected to the pull-up node, and a second terminal thereof is connected to the signal output terminal.

Alternatively, the pull-down node control unit can comprise: a sixth transistor, a seventh transistor, an eighth transistor, and a ninth transistor. Herein, a first electrode of the sixth transistor is connected to the pull-down node, a second electrode thereof is connected to the low level terminal, and a control electrode thereof is connected to the pull-up node; a first electrode of the seventh transistor is connected to a control electrode of the eighth transistor and a second electrode of the ninth transistor, a second electrode thereof is connected to the low level terminal, and a control electrode thereof is connected to the pull-up node; a first electrode of the eighth transistor is connected to the high level terminal, a second electrode thereof is connected to the pull-down node, and the control electrode thereof is connected to the second electrode of the ninth transistor; both a first electrode and a control electrode of the ninth transistor are connected to the high level terminal, and the second electrode thereof is connected to the control electrode of the eighth transistor.

Alternatively, the noise reduction unit can comprise: a fourth transistor and a tenth transistor. Herein, a first electrode of the fourth transistor is connected to the signal output terminal, a second electrode thereof is connected to the low level terminal, and a control electrode thereof is connected to the pull-down node; a first electrode of the tenth transistor is connected to the pull-up node, a second electrode thereof is connected to the low level terminal, and a control electrode thereof is connected to the pull-down node.

Alternatively, the touch scanning control unit can comprise: a fifth transistor, an eleventh transistor, and a twelfth transistor. A first electrode of the fifth transistor is connected to the signal output terminal, a second electrode thereof is connected to the low level terminal, and a control electrode thereof is connected to the control signal input terminal; a first electrode of the eleventh transistor is connected to a second electrode of the twelfth transistor, and both a second electrode and a control electrode are connected to the pull-up node; both a first electrode and a control electrode of the twelfth transistor are connected to the control signal input terminal, and the second electrode thereof is connected to the first electrode of the eleventh transistor.

In another embodiment, a technical solution adopted to solve the technical problem of the present disclosure is as follows: a gate driving circuit, comprising a plurality of shift registers connected in cascades.

In another embodiment, a technical solution adopted to solve the technical problem of the present disclosure is as follows: a display apparatus, comprising the gate driving circuit.

The shift register of embodiments of the present disclosure is added with the touch scanning control unit as compared with a conventional shift register, can realize the touch function and the display scanning function of the conventional shift register by adjusting the signal input by the control signal input terminal, and can be switched between the conventional shift register and the shift register having the touch scanning function. The shift register of the embodiments of the present disclosure is compatible with a variety of functions, has greater functionality, and is more practical.

DETAILED DESCRIPTION

In order to make those skilled in the art understand technical solutions of the present disclosure, the present disclosure will be further described in detail by combing with accompanying drawings and specific implementations.

First Embodiment

Figure 1:
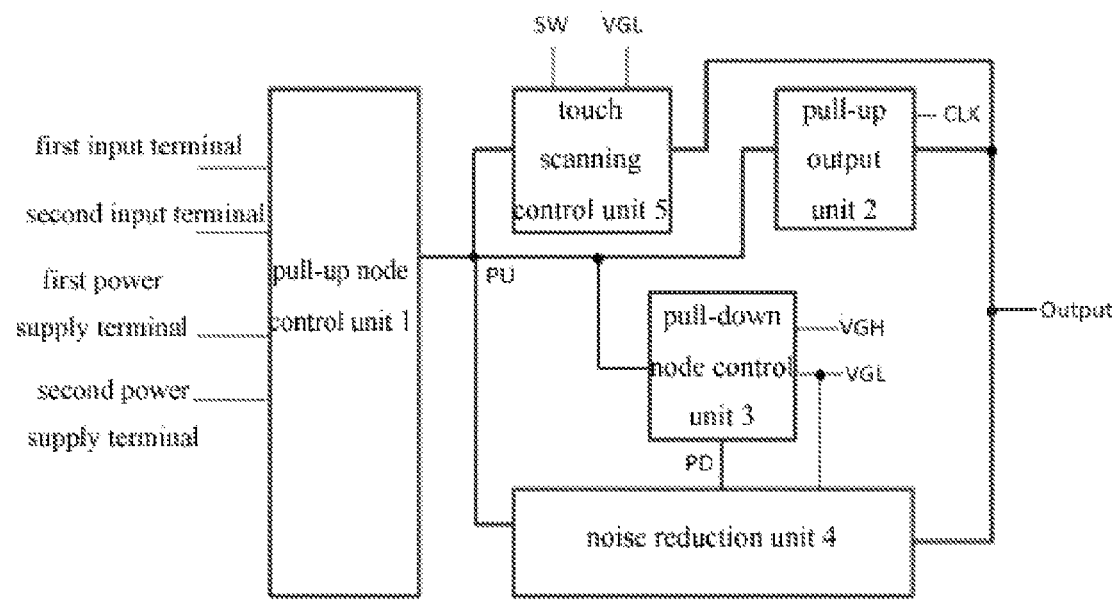
FIG. 1 is block diagram of a shift register according to a first embodiment of the present disclosure.

As shown in FIG. 1, there is provided in the embodiment a shift register, comprising a pull-up node control unit 1, a pull-up output unit 2, a pull-down node control unit 3, a noise reduction unit 4, and a touch scanning control unit 5. Herein, the pull-up node control unit 1 is connected to a first input terminal, a second input terminal, a first power supply terminal, a second power supply terminal, and a pull-up node PU, and is configured to control a potential of the pull-up node PU according to control signals input by the first input terminal and the second input terminal, the pull-up node PU is a connection node between the pull-up node control unit 1 and the pull-up output unit 2. The pull-down node control unit 3 is connected to a high level terminal VGH, a low level terminal VGL and the pull-up node PU and a pull-down node PD, and is configured to control a potential of the pull-down node PD according to the potential of the pull-up node PU, the pull-down node PD is a connection node between the pull-down node control unit 3 and the noise reduction unit 4. The pull-up output unit 2 is connected to a clock signal input terminal CLK, the pull-up node PU, a signal output terminal Output, and is configured to control an output of the signal output terminal Output according to the potential of the pull-up node PU and a clock signal input by the clock signal input terminal CLK. The noise reduction 4 is connected to the pull-up node PU, the pull-down node PD, the low level terminal VGL and the signal output terminal Output, and is configured to reduce noise for the pull-up node PU and the signal output terminal Output through a signal input by the low level terminal VGL under the control of the pull-down node PD. The touch scanning control unit 5 is connected to a control signal input terminal SW, the pull-up node PU, the signal output terminal Output, and the low level terminal VGL, and is configured to control an operation time in a touch scanning phase and potentials of the pull-up node PU and the signal output terminal Output according to the signal input by the control signal input terminal SW.

Compared with a conventional shift register used for the GOA circuit, the shift register of the present embodiment is added with the touch scanning control unit 5, can realize the touch scanning function and the display scanning function of the conventional shift register simultaneously by adjusting the signal input by the control signal input terminal SW, and can be switched between the conventional shift register and the shift register having the touch scanning function.

In particular, when the control signal input terminal SW is input a first level signal, the touch scanning control unit 5 is switched off. At this time, the shift register is equivalent to the conventional shift register, and can realize the function of the conventional shift register. When the control signal input terminal SW is input a second level signal different from the first level signal, the touch scanning control unit 5 is switched on. At this time, the shift register realizes the touch scanning function. Herein, operation time in a touch scanning phase is controlled according to the signal input by the control signal input terminal SW. As a first touch scanning mode of the present embodiment, the second level signal is input to the control signal input terminal SW between display phases of two adjacent frame pictures, so as to realize V-Blank touch scanning. As a second touch scanning mode of the present embodiment, the second level signal is input to the control signal input terminal SW in the display phase of each frame picture, so as to realize H-Blank touch scanning. After the touch scanning phase ends up, the first level signal is input to the control signal input terminal SW, so as to continuously realize display scanning operation of the display panel. In the present embodiment, the first level signal can be a low level signal, and the second level signal can be a high level signal, but the present disclosure is not limited thereto.

The shift resister of the embodiment can further realize a two-way display scanning function. That is, the shift register of the present embodiment can operate either in a forward display scanning mode or in a backward display scanning mode.

In particular, in the forward display scanning mode, the first input terminal of the shift register as shown in FIG. 1 is a signal input terminal Input, and the second input terminal thereof is a reset signal input terminal Reset. When M shift registers are connected in cascades, for a N-th stage of shift register (N<M), a signal input by the first input terminal (i.e., signal input terminal Input) is a signal Output (N−1) output by a signal output terminal of a previous stage of shift register of the N-th stage of shift register (i.e., (N−1)-th stage of shift register), and a signal input by the second input terminal (i.e., reset signal input terminal Reset) is a signal Output(N+1) output by a signal output terminal of a next stage of shift register of the N-stage of shift register (i.e., (N+1)-th stage of shift register). In this way, the forward display scanning function is realized.

In the backward display scanning mode, the first input terminal of the shift register as shown in FIG. 1 is the reset signal input terminal Reset, and the second input terminal thereof is the signal input terminal Input. When M shift registers are connected in cascades, for a N-th stage of shift register (N<M), the signal input by the first input terminal (i.e., reset signal input terminal Reset) is the signal Output (N+1) output by the signal output terminal of the next stage of shift register of the N-th stage of shift register (i.e., (N+1)-th stage of shift register), and the signal input by the second input terminal (i.e., signal input terminal Input) is the signal Output(N−1) output by the signal output terminal of the previous stage of shift register of the N-stage of shift register (i.e., (N−1)-th stage of shift register). In this way, the backward display scanning function is realized.

To sum up, the shift register of the present embodiment is a multi-functional shift register. It can not only realize the function of the conventional shift register but also realize the V-Blank touch scanning function and H-Blank touch scanning function, as well as the two-way display scanning function. Therefore, the shift register of the present embodiment is more applicable.

Second Embodiment

Figure 2:
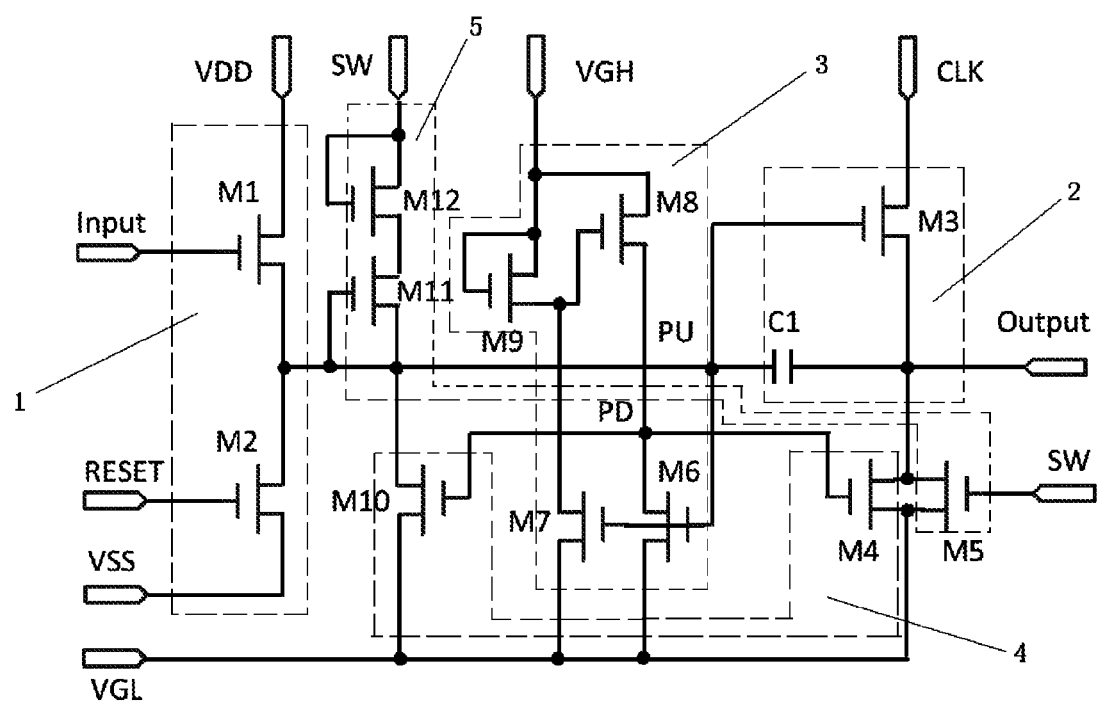
FIG. 2 is a schematic diagram of a circuit of a shift register in a forward display scanning mode according to a second embodiment of the present disclosure.
Figure 3:
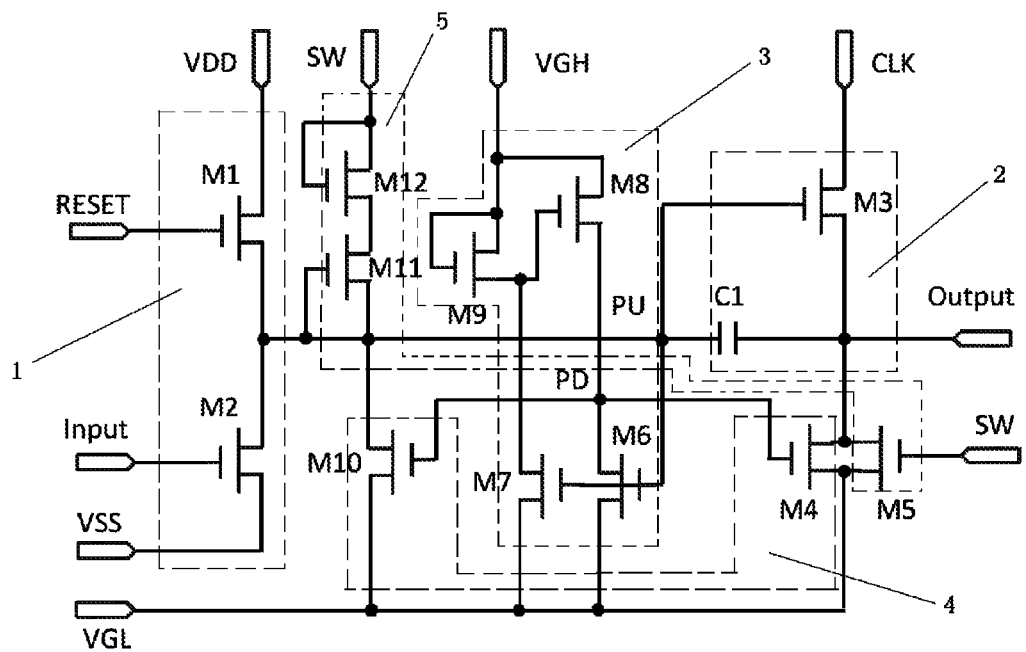
FIG. 3 is a schematic diagram of a circuit of a shift register in a backward display scanning mode according to a second embodiment of the present disclosure.

As shown in FIGS. 2 and 3, there is provided in the present embodiment a shift register, comprising a pull-up node control unit 1, a pull-up output unit 2, a pull-down node control unit 3, a noise reduction unit 4 and a touch scanning control unit 5. FIG. 2 is a schematic diagram of a circuit of the shift register of the present embodiment in the forward display scanning mode. FIG. 3 is a schematic diagram of a circuit of the shift register of the present embodiment in the backward display scanning mode. Functions of the above respective units are the same as the function of corresponding units in the shift register provided in the first embodiment as shown in FIG. 1.

In the present embodiment, the pull-up node control unit 1 comprises: a first transistor M1 and a second transistor M2.

In particular, shown in FIG. 2, when the shift register realizes the forward display scanning function, a first electrode of the first transistor M1 is connected to a high voltage power supply terminal VDD (i.e., first power supply terminal), a second electrode thereof is connected to the pull-up node PU, and a control electrode thereof is connected to a signal input terminal Input (first input terminal); a first electrode of the second transistor M2 is connected to the pull-up node PU, a second electrode thereof is connected to a low voltage power supply terminal VSS (i.e., second power supply terminal), and a control electrode thereof is connected to a reset signal input terminal Reset (second input terminal).

As shown in FIG. 3, when the shift register realizes the backward display scanning function, the first electrode of the first transistor M1 is connected to the high voltage power supply terminal VDD (i.e., first power supply terminal), the second electrode thereof is connected to the pull-up node PU, and the control electrode thereof is connected to the reset signal input terminal Reset (first input terminal), the first electrode of the second transistor M2 is connected to the pull-up node PU, the second electrode thereof is connected to the low voltage power supply terminal VSS (i.e., second power supply terminal), and the control electrode thereof is connected to the signal input terminal Input (second input terminal); or, the first electrode of the first transistor M1 is connected to the low voltage power supply terminal VSS, the second electrode thereof is connected to the pull-up node PU, and the control electrode thereof is connected to the signal input terminal Input, the first electrode of the second transistor M2 is connected to the pull-up node PU, the second electrode thereof is connected to the high voltage power supply terminal VDD, and the control electrode thereof is connected to the reset signal input terminal Reset.

In the present embodiment, the pull-up output unit 2 comprises: a third transistor M3 and a storage capacitor C1; a first electrode of the third transistor M3 is connected to the clock signal input terminal CLK, a second electrode thereof is connected to the signal output terminal Output, and a control electrode thereof is connected to the pull-up node PU; a first terminal of the storage capacitor C1 is connected to the pull-up node PU, and a second terminal thereof is connected to the signal output terminal Output.

In the present embodiment, the pull-down node control unit 3 comprises: a sixth transistor M6, a seventh transistor M7, an eighth transistor M8, and ninth transistor M9; a first electrode of the sixth transistor M6 is connected to the pull-down node PD, a second electrode thereof is connected to the low level VGL, and a control electrode thereof is connected to the pull-up node PU; a first electrode of the seventh transistor M7 is connected to a control electrode of the eighth transistor M8 and a second electrode of the ninth transistor M9, a second electrode thereof is connected to the low level terminal VGL, and a control electrode thereof is connected to the pull-up node PU; a first electrode of the eighth transistor M8 is connected to the high level terminal VGH, a second electrode thereof is connected to the pull-down node PD, and the control electrode thereof is connected to the second electrode of the ninth transistor M9; both a first electrode and a control electrode of the ninth transistor M9 are connected to the high level terminal VGH, and the second electrode thereof is connected to the control electrode of the eighth transistor M8.

In the present embodiment, the noise reduction unit 4 comprises: a fourth transistor M4 and a tenth transistor M10; a first electrode of the fourth transistor M4 is connected to the signal output terminal Output, a second electrode thereof is connected to the low level terminal VGL, and a control electrode thereof is connected to the pull-down node PD; a first electrode of the tenth transistor M10 is connected to the pull-up node PU, a second electrode thereof is connected to the low level terminal VGL, and a control electrode thereof is connected to the pull-down node PD.

In the present embodiment, the touch scanning control unit 5 comprises: a fifth transistor M5, an eleventh transistor M11, a twelfth transistor M12; a first electrode of the fifth transistor M5 is connected to the signal output terminal Output, a second electrode thereof is connected to the low level terminal VGL, and a control electrode thereof is connected to the control signal input terminal SW; a first electrode of the eleventh transistor M11 is connected to a second electrode of the twelfth transistor, and both a second electrode and a control electrode thereof are connected to the pull-up node PU; both a first electrode and a control electrode of the twelfth transistor M12 are connected to the control signal input terminal SW, and the second electrode thereof is connected to the first electrode of the eleventh transistor M11.

Figure 4:
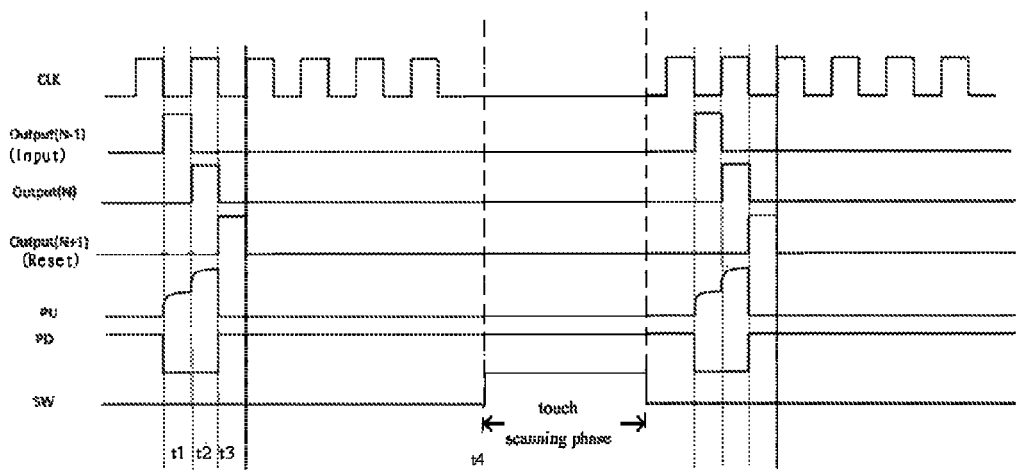
FIG. 4 is a timing diagram of a first touch scanning mode of the shift register in FIG. 2.
Figure 5:
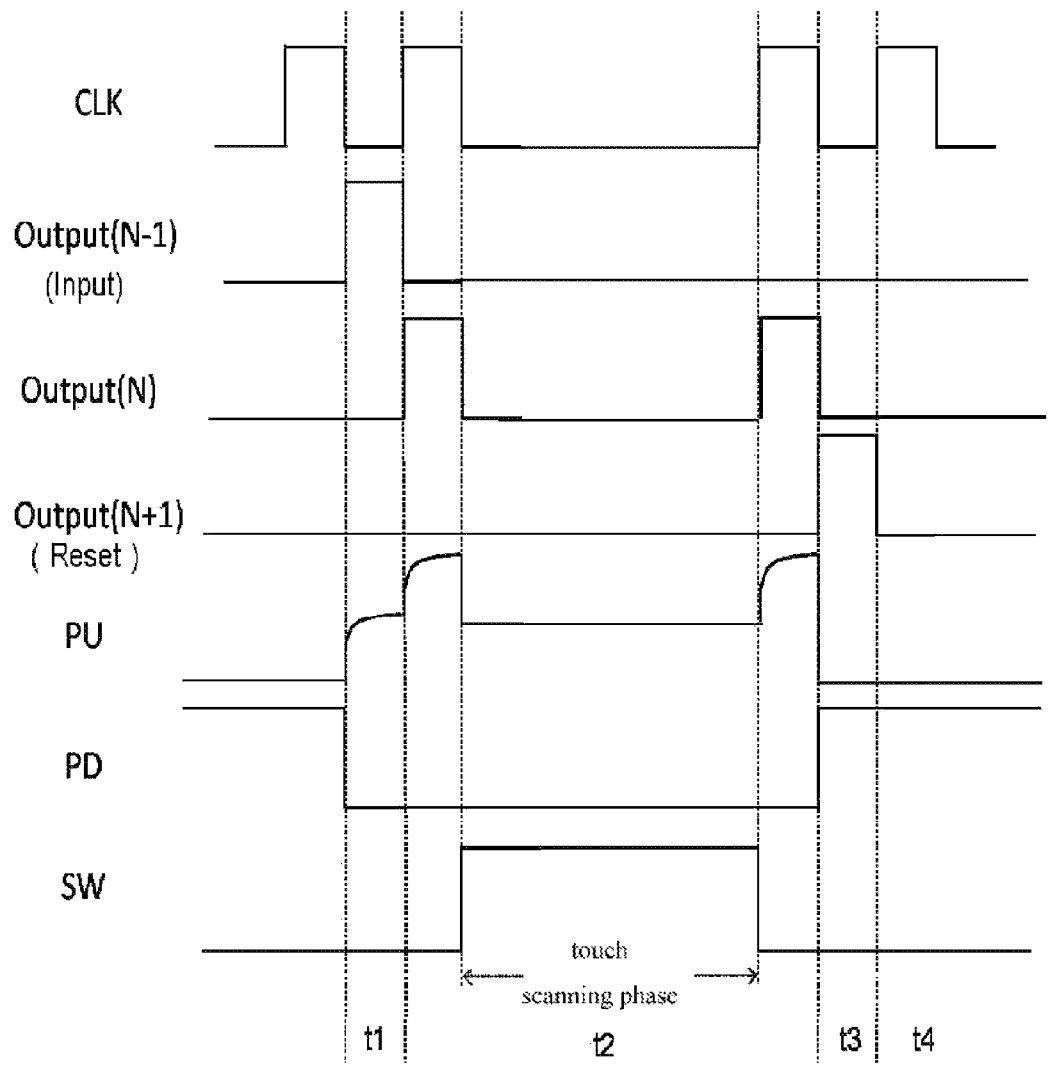
FIG. 5 is a timing diagram of a second touch scanning mode of the shift register in FIG. 2.

The shift register of the present embodiment can realize respectively the V-Blank touch scanning (i.e., first touch scanning) function and the H-Blank touch scanning (i.e., second touch scanning) function under the control of different timings. The V-Blank touch scanning function and the H-Blank touch scanning function of the present embodiment will be described by combining with the timing diagrams as shown in FIGS. 4 and 5 by taking the shift register that can realize the forward display scanning function as shown in FIG. 2 as an example. Herein, the current shift register is the N-th stage of shift register of the M shift registers connected in cascades.

FIG. 4 shows a timing diagram of a first touch scanning mode of a shift register. In this mode, the shift register realizes the V-Blank touch scanning function of a touch screen. The first touch scanning mode comprises specifically following phases: a pre-charging phase, a pull-up output phase, a reset phase, and a noise reduction phase, wherein the noise reduction phase comprises a touch scanning phase occurring between display phases of two adjacent frame pictures.

In a pre-charging phase t1, when a signal input by the signal input terminal Input is a high level, the first transistor M1 is turned on. At this time, the signal input by the signal input terminal Input is a signal Output(N−1) output by an output terminal of a previous stage of shift register (i.e., a (N−1)-th stage of shift register) (if a current shift register is a first stage of shift register (i.e., N=1), then the signal input by the signal input terminal Input is a frame start signal STV). After the first transistor M1 is turned on, a power supply voltage input by the high voltage power supply terminal VDD charges the storage capacitor C1 through the first transistor M1, such that the voltage of the pull-up node PU is pulled up; at this time, the third transistor M3 is turned on. Since the clock signal CLK is a low potential in the pre-charging phase, the signal output terminal Output outputs a low level; at the same time, the sixth transistor M6 and the seventh transistor M7 are turned on, the eighth transistor M8 is turned off, and the potential of the pull-down node PD is pulled down to the low level through the sixth transistor M6; the potential of the pull-down node PD is the low level, so that the fourth transistor M4 and the tenth transistor M10 are turned off, thereby ensuring stability of the output Output(N) of the signal output terminal.

In a pull-up output phase t2, a signal input by the control signal input terminal SW is a low level signal, so that the fifth transistor M5 and the twelfth transistor M12 are in a turn-off state. When the signal input by the signal input terminal Input is the low level, the first transistor M1 is turned off, the pull-up node PU continues to maintain a high potential, and the third transistor M3 maintains in a turn-on state. Since the signal input by the clock signal input terminal CLK is the high potential in the pull-up output phase, the pull-up node PU enables to increase the voltage of the pull-up node due to bootstrapping, and finally transmits a drive signal (high level signal) to the signal output terminal Output; at this time, the pull-up node PU is the high potential, the sixth transistor M6 and the seventh transistor M7 are still in the turn-on state, and the potential of the pull-down node PD is still the low level, so that the fourth transistor M4 and the tenth transistor M10 are turned off continuously, thereby ensuring stability of the output Output(N) of the signal output terminal.

In a reset phase t3, a signal input by the reset signal input terminal Reset is a signal Output(N+1) output by a signal output terminal of a next stage of shift register (i.e., a (N+1)-th stage of shift register). At this time, the signal input by the reset signal input terminal Reset is a high level signal, so that the second transistor M2 is in the turn-on state. The low voltage power supply terminal VSS pulls down the potential of the pull-up node PU through the second transistor M2, so that the third transistor M3, the sixth transistor M6 and the seventh transistor M7 are turned off; at the same time, the eighth transistor M8 and the ninth transistor M9 are turned on by the high level terminal VGH, so that the potential of the pull-down node PD is at the high level. At this time, the fourth transistor M4 and the tenth transistor M10 are turned on, and the potentials of the signal output terminal Output and the pull-up node PU are pulled down to the potential of the low level terminal VGL, so that resetting of the shift register is realized.

In a noise reduction phase t4, the first transistor M1 is always in the turn-off state. The high level terminal VGH is the high potential, and the eighth transistor M8 and the ninth transistor M9 are always in the turn-on state, so that the pull-down node PD is always at the high potential when the signal output terminal Output outputs the low level (in a previous phase, the signal output terminal Output has been pulled down to the low level). Thus, the fourth transistor M4 and the tenth transistor M10 are turned on, and the processes of noise reduction are constantly performed on the pull-up node PU and the signal output terminal Output. The above processes could make the noise voltages produced by the clock signal input terminal CLK eliminated, so as to realize the low voltage output and ensure stability of the output Output(N) of the signal output terminal.

Before a next frame arrives, the shift register has been in the noise reduction phase, and the noise reduction of the shift register is constantly performed.

A period of time between the end of display of a current frame picture and the start of display of a next frame picture is the touch scanning phase. In this phase, when the touch scanning signal arrives, the signal input by the control signal input terminal SW becomes a high level signal. At this time, the fifth transistor M5 is turned on, so that the signal output Output(N) outputs the low level continuously (that is, a gate signal of a driven thin film transistor is the low level), thereby ensuring that the gate signal has no interference on the touch scanning signal, and ensuring the touch scanning function; at the same time, since the signal input by the control signal input terminal SW is the high level signal, the twelfth transistor M12 is turned on. However, since the potential of the pull-up node PU is the low level at this time and the eleventh transistor M11 is turned off, the potential of the pull-up node PU would not be affected. At the same time, since the pull-up node PU is at the low level, subsequent operations would not be affected. After the touch scanning phase ends up (i.e., the start time of the display phase of the next frame picture), the control signal input terminal SW is input the low level, and then operation of display scanning of the next frame picture continues.

FIG. 5 shows a timing diagram of a second touch scanning mode of the shift register. In the mode, the shift register realizes the H-Blank touch scanning function of a touch screen. The second touch scanning mode comprises specifically following phases: a pre-charging phase, a pull-up output phase, a reset phase, and a noise reduction phase, wherein the pull-up output phase comprises a touch scanning phase.

In a pre-charging phase t1, when a signal input by the signal input terminal Input is a high level, the first transistor M1 is turned on. Herein, the signal input by the signal input terminal Input is a signal Output(N−1) output by an output terminal of a previous stage of shift register (i.e., a (N−1)-th stage of shift register) (if a current shift register is a first stage of shift register (i.e., N=1), then the signal input by the signal input terminal Input is a frame start signal STV). After the first transistor M1 is turned on, a power supply voltage input by the high voltage power supply terminal VDD charges the storage capacitor C1 through the first transistor M1, such that the voltage of the pull-up node PU is pulled up; now, the third transistor M3 is turned on. Since the clock signal CLK is a low potential in the pre-charging phase, the signal output terminal Output outputs a low level; at the same time, the sixth transistor M6 and the seventh transistor M7 are turned on, so that the eighth transistor M8 is turned off, and the potential of the pull-down node PD is pulled down to the low level through the sixth transistor M6; the potential of the pull-down node PD is the low level, so that the fourth transistor M4 and the tenth transistor M10 are turned off, thereby ensuring stability of the output Output of the signal output terminal.

In a pull-up output phase t2, a signal input by the control signal input terminal SW is a low level signal, so that the fifth transistor M5 and the twelfth transistor M12 are in a turn-off state. When the signal input by the signal input terminal Input is the low level, the first transistor M1 is turned off, the pull-up node PU continues to maintain the high potential, and the third transistor M3 maintains in a turn-on state. Since the signal input by the clock signal input terminal CLK is the high potential in the pull-up output phase, the pull-up node PU enables to increase the voltage of the pull-up node due to bootstrapping, and finally a drive signal (high level signal) is transmitted to the signal output terminal Output; now, the pull-up node PU is the high potential, the sixth transistor M6 and the seventh transistor M7 are still in the turn-on state, and the potential of the pull-down node PD is still the low level, so that the fourth transistor M4 and the tenth transistor M10 are turned off continuously, thereby ensuring stability of the output Output (N) of the signal output terminal.

Herein, when the touch scanning signal arrives, the control signal input terminal SW is input a high level signal, and the twelfth transistor M12 is turned on. Since the H-Blank touch scanning mode is performed during the display scanning process of each frame of the shift register, the pull-up node PU continues to be the high voltage, and the signal input by the clock signal input terminal CLK is the low level. However, since the signal input by the signal input terminal SW is the high voltage, the fifth transistor M5 is turned on, noise reduction is performed on the signal output terminal Output, and the signal output terminal Output outputs the low level signal (that is, a gate signal of a driven thin film transistor is the low level), thereby ensuring that the gate signal has no interference on the touch scanning signal and ensuring the touch scanning function. At the same time, since the potential of the pull-up PU is the high level at this time, the eleventh transistor M11 is in the turn-on state, and the signal input by the control signal input terminal SW charges additionally the storage capacitor C1, which avoids the problem of decrease of the potential of the pull-up node PU caused by electricity leakage of the second transistor M2 and the tenth transistor M10, so that the shift register would not suffer no output or suffer too low output voltage after the touch scanning phase ends up. At the same time, since the pull-up node PU of other rows is at the low level, subsequent operations of other rows would not be affected. After the touch scanning phase ends up, the control signal input terminal SW is input the low level, and the operation in the pull-up output phase continues.

In a reset phase t3, a signal input by the reset signal input terminal Reset is a signal Output(N+1) output by a signal output terminal of a next stage of shift register (i.e., a (N+1)-th stage of shift register). At this time, the input signal is a high level signal, so that the second transistor M2 is in the turn-on state. The low voltage power supply terminal VSS pulls down the potential of the pull-up node PU through the second transistor M2, so that the third transistor M3, the sixth transistor M6 and the seventh transistor M7 are turned off; at the same time, the eighth transistor M8 and the ninth transistor M9 are turned on by the high level terminal VGH, so that the potential of the pull-down node PD is at the high level. At this time, the fourth transistor M4 and the tenth transistor M10 are turned on, and the potential of the signal output terminal Output and the pull-up node PU is pulled down to the potential of the low level terminal VGL, so that resetting of the shift register is realized.

In a noise reduction phase t4, the first transistor M1 is always in the turn-off state. The high level terminal VGH is the high potential, and the eighth transistor M8 and the ninth transistor M9 are always in the turn-on state, so that the pull-down node PD is always at the high potential when the low level is output by the signal output terminal Output (in a previous phase, the signal output terminal Output has been pulled down to the low level). Thus, the fourth transistor M4 and the tenth transistor M10 are turned on, and noise reduction is constantly performed on the pull-up node PU and the signal output terminal Output. The above processes can make the noise produced by the clock signal input terminal CLK eliminated, so as to realize the low voltage output and ensure stability of the output of the signal output terminal.

Before display of a next frame picture starts, the shift register has been in the noise reduction phase, the noise reduction of the shift register is constantly performed, and the operation in the noise reduction phase is repeated.

The processes that the shift register of the present embodiment realizes the V-Blank touch scanning (i.e., first touch scanning) function and the H-Blank touch scanning (i.e., second touch scanning) function are described above by taking the shift register used to realize the forward display scanning function as shown in FIG. 2 as an example. It should be understood that the V-Blank touch scanning (i.e., first touch scanning) function and the H-Blank touch scanning (i.e., second touch scanning) function can also be realized on the basis of the shift register that can realize the backward display scanning function as shown in FIG. 3. It is noted that the difference between the shift registers as shown in FIGS. 2 and 3 only lies in mutual exchange of the signals input by the first input terminal and the second input terminal, or mutual exchange of signals input by the first power supply terminal and the second power supply terminal, that is, in the shift register as shown in FIG. 3, the first electrode of the first transistor M1 is connected to the high voltage power supply terminal VDD, the second electrode thereof is connected to the pull-up node PU, and the control electrode thereof is connected to the reset signal input terminal Reset, the first electrode of the second transistor M2 is connected to the pull-up node PU, the second electrode thereof is connected to the low voltage power supply terminal VSS, and the control electrode thereof is connected to the signal input terminal Input; or the first electrode of the first transistor M1 is connected to the low voltage power supply terminal VSS, the second electrode thereof is connected to the pull-up node PU, and the control electrode thereof is connected to the signal input terminal Input, the first electrode of the second transistor M2 is connected to the pull-up node PU, the second electrode thereof is connected to the high voltage power supply terminal VDD, and the control electrode thereof is connected to the reset signal input terminal Reset. Since the signal input by the signal input terminal Input is the signal Output(N−1) output by the signal output terminal of the previous stage of shift register (i.e., the (N−1)-th stage of shift register), and the signal input by the reset signal input terminal Reset is the signal Output (N+1) output by the signal output terminal of the next stage of shift register (i.e., the (N+1)-th stage of shift register), this shift register can realize the backward display scanning function. When the shift register realizes the V-Blank touch scanning (i.e., first touch scanning) function and the H-Blank touch scanning (i.e., second touch scanning) function, its operation principle is the same the operation principle of the shift register that realizes the forward display scanning function, and thus no further detailed description is given herein.

In addition, in the present embodiment, the first transistor M1 to the twelfth transistor M12 are N-type transistor, but the present disclosure is not limited thereto. At least one of the first transistor M1 to the twelfth transistor M12 can also be a P-type transistor, and the signal level of its control electrode can be changed correspondingly.

To sum up, there is presented in the present embodiment a shift register having the touch scanning function. This shift register can realize the shift register having the touch scanning function (both the H-Blank touch scanning function and the V-Blank touch scanning function) and the display scanning function of the conventional shift register in a simple manner. When touch scanning transmission is conducted, a display control signal has been stored. After the touch scanning transmission is completed, the display control signal continues to scan, so as to avoid the touch scanning and display control signals from interfering with each other. The shift register can realize switching between the shift register having the touch function and the conventional shift register through the signal provided by the control signal input terminal SW, so that the problem of electricity leakage upon maintaining the voltage of the pull-up node PU is solved, and the subsequent normal operations of pixels of other rows of the touch screen would not be affected. At the same time, in a non-operation state, the pull-down node PD can be constantly in the high potential, and noise reduction is continuously performed, so that yield rate is raided. In addition, such design could realize the two-way display scanning.

Third Embodiment

Figure 6:
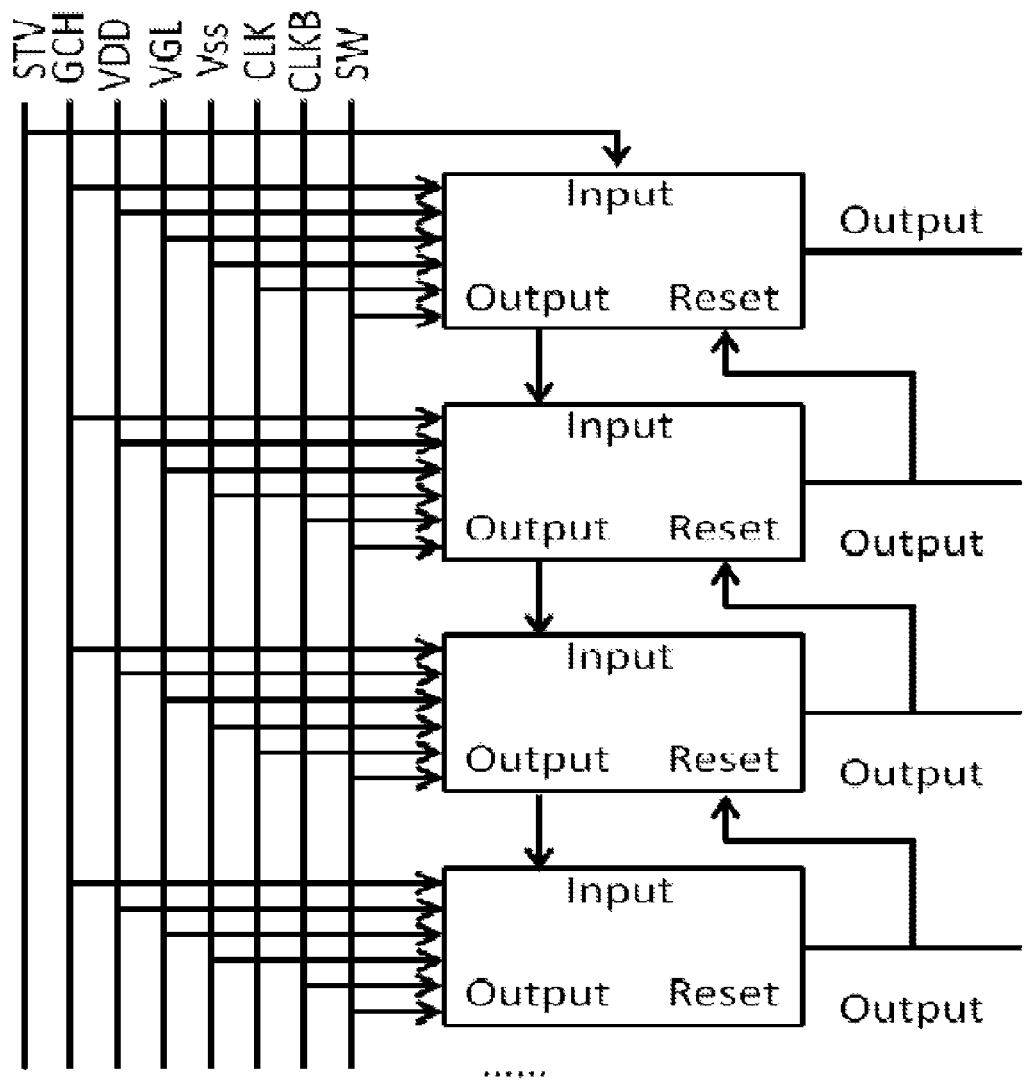
FIG. 6 is a schematic diagram of a gate driving circuit according to a third embodiment of the present disclosure.

As shown in FIG. 6, there is provided in the embodiment a gate driving circuit, comprising a plurality of shift registers connected in cascades. The shift register is the shift register in the first or second embodiment, wherein a signal input terminal Input of each stage of shift register is connected to a signal output terminal Output of a previous stage of shift register, and a reset signal input terminal Reset thereof is connected to a signal output terminal Output of a next stage of shift register.

Fourth Embodiment

There is provided in the embodiment a display apparatus, comprising the gate driving circuit as described in the third embodiment. Therefore, the display apparatus can realize a narrow-frame design.

The display apparatus may be any product or means having the display function, such as a mobile phone, a tablet computer, a television set, a display, a notebook computer, a digital photo frame, a navigator, or the like.

Of course, the display apparatus of the embodiment can further comprise other conventional configurations, such as a power supply unit, a display driving unit, etc.

It may be understood that the above implementations are exemplary implementations adopted to describe the principle of the present disclosure. However, the present disclosure is not limited thereto. For those ordinary skilled in the art, various improvements and modifications can be made without departing from the spirit and substance of the present disclosure and these improvements and modifications shall be deemed as falling into the protection scope of the present disclosure.

What is claimed is:

1. A shift register, comprising:
  a pull-up node control unit, connected to a first input terminal, a second input terminal, a first power supply terminal, a second power supply terminal, and a pull-up node, and configured to control a potential of the pull-up node according to a control signal input by the first input terminal and the second input terminal, the pull-up node being a connection node between the pull-up node control unit and the pull-up output unit;
  a pull-down node control unit, connected to a high level terminal, a low level terminal and the pull-up node and a pull-down node, and configured to control a potential of the pull-down node according to the potential of the pull-up node, the pull-down node being a connection node between the pull-down node control unit and the noise reduction unit;
  a pull-up output unit, connected to a clock signal input terminal, the pull-up node, a signal output terminal, and configured to control a potential of the signal output terminal according to the potential of the pull-up node and a clock signal input by the clock signal input terminal;
  a noise reduction unit, connected to the pull-up node, the pull-down node, the low level terminal and the signal output terminal, and configured to reduce noise for the pull-up node and the signal output terminal through a signal input by the low level terminal under the control of the pull-down node;
  a touch scanning control unit, connected to a control signal input terminal, the pull-up node, the signal output terminal, and the low level terminal, and configured to control an operation time in a touch scanning phase and potentials of the pull-up node and the signal output terminal according to the signal input by the control signal input terminal.

2. The shift register according to claim 1, wherein the touch scanning control unit makes the touch scanning phase occur between display phases of two adjacent frame pictures under the control of a signal input by the control signal input terminal.

3. The shift register according to claim 1, wherein the touch scanning control unit makes the touch scanning phase occur in a display phase of each frame picture under the control of the signal input by the control signal input terminal.

4. The shift register according to claim 1, wherein the pull-up node control unit comprises: a first transistor and a second transistor;
  a first electrode of the first transistor is connected to a first power supply terminal, a second electrode thereof is connected to the pull-up node, and a control electrode thereof is connected to the first input terminal; and
  a first electrode of the second transistor is connected to the pull-up node, a second electrode thereof is connected to the second power supply terminal, and a control electrode thereof is connected to the second input terminal.

5. The shift register according to claim 1, wherein the first power supply terminal is a high voltage power supply terminal, and the second power supply terminal is a low voltage power supply terminal; the signal input by the first input terminal is a signal output by a signal output terminal of a previous stage of shift register of the shift register, and the signal input by the second input terminal is a signal output by a signal output terminal of a next stage of shift register of the shift register, such that the shift register realizes displaying and scanning forwards.

6. The shift register according to claim 1, wherein the first power supply terminal is a high voltage power supply terminal, and the second power supply terminal is a low voltage power supply terminal; the signal input by the first input terminal is a signal output by a signal output terminal of the next stage of shift register of the shift register, and the signal input by the second input terminal is a signal output by a signal output terminal of the previous stage of shift register of the shift register; or, the first power supply terminal is a low voltage power supply terminal, and the second power supply terminal is a high voltage power supply terminal; the signal input by the first input terminal is a signal output by a signal output terminal of the previous stage of shift register of the shift register, and the signal input by the second input terminal is a signal output by a signal output terminal of the next stage of shift register of the shift register, such that the shift register realizes displaying and scanning forwards.

7. The shift register according to claim 1, wherein the pull-up output unit comprises: a third transistor and a storage capacitor;
  a first electrode of the third transistor is connected to the clock signal input terminal, a second electrode thereof is connected to a signal output terminal, and a control electrode thereof is connected to the pull-up node; and
  a first terminal of the storage capacitor is connected to the pull-up node, and a second terminal thereof is connected to the signal output terminal.

8. The shift register according to claim 1, wherein the pull-down node control unit comprises: a sixth transistor, a seventh transistor, an eighth transistor, and a ninth transistor;
  a first electrode of the sixth transistor is connected to the pull-down node, a second electrode thereof is connected to the low level terminal, and a control electrode thereof is connected to the pull-up node;
  a first electrode of the seventh transistor is connected to a control electrode of the eighth transistor and a second electrode of the ninth transistor, a second electrode thereof is connected to the low level terminal, and a control electrode thereof is connected to the pull-up node;
  a first electrode of the eighth transistor is connected to the high level terminal, a second electrode thereof is connected to the pull-down node, and the control electrode thereof is connected to the second electrode of the ninth transistor;
  a first electrode and a control electrode of the ninth transistor are both connected to the high level terminal, and the second electrode thereof is connected to the control electrode of the eighth transistor.

9. The shift register according to claim 1, wherein the noise reduction unit comprises: a fourth transistor and a tenth transistor; wherein
  a first electrode of the fourth transistor is connected to the signal output terminal, a second electrode thereof is connected to the low level terminal, and a control electrode thereof is connected to the pull-down node; and
  a first electrode of the tenth transistor is connected to the pull-up node, a second electrode thereof is connected to the low level terminal, and a control electrode thereof is connected to the pull-down node.

10. The shift register according to claim 1, wherein the touch scanning control unit comprises: a fifth transistor, an eleventh transistor, and a twelfth transistor; wherein
a first electrode of the fifth transistor is connected to the signal output terminal, a second electrode thereof is connected to the low level terminal, and a control electrode thereof is connected to the control signal input terminal;
a first electrode of the eleventh transistor is connected to a second electrode of the twelfth transistor, and a second electrode and a control electrode are both connected to the pull-up node; and
a first electrode and a control electrode of the twelfth transistor are both connected to the control signal input terminal, and the second electrode thereof is connected to the first electrode of the eleventh transistor.

11. A gate driving circuit, comprising a plurality of shift registers connected in cascades according to claim 1.

12. A display apparatus, comprising the gate driving circuit according to claim 11.

13. The gate driving circuit according to claim 11, wherein the touch scanning control unit makes the touch scanning phase occur between display phases of two adjacent frame pictures or in a display phase of each frame picture under the control of a signal input by the control signal input terminal.

14. The gate driving circuit according to claim 11, wherein the pull-up node control unit comprises: a first transistor and a second transistor;
a first electrode of the first transistor is connected to a first power supply terminal, a second electrode thereof is connected to the pull-up node, and a control electrode thereof is connected to the first input terminal; and
a first electrode of the second transistor is connected to the pull-up node, a second electrode thereof is connected to the second power supply terminal, and a control electrode thereof is connected to the second input terminal.

15. The gate driving circuit according to claim 11, wherein the first power supply terminal is a high voltage power supply terminal, and the second power supply terminal is a low voltage power supply terminal; the signal input by the first input terminal is a signal output by a signal output terminal of a previous stage of shift register of the shift register, and the signal input by the second input terminal is a signal output by a signal output terminal of a next stage of shift register of the shift register, such that the shift register realizes displaying and scanning forwards.

16. The gate driving circuit according to claim 11, wherein the first power supply terminal is a high voltage power supply terminal, and the second power supply terminal is a low voltage power supply terminal; the signal input by the first input terminal is a signal output by a signal output terminal of the next stage of shift register of the shift register, and the signal input by the second input terminal is a signal output by a signal output terminal of the previous stage of shift register of the shift register; or, the first power supply terminal is a low voltage power supply terminal, and the second power supply terminal is a high voltage power supply terminal; the signal input by the first input terminal is a signal output by a signal output terminal of the previous stage of shift register of the shift register, and the signal input by the second input terminal is a signal output by a signal output terminal of the next stage of shift register of the shift register, such that the shift register realizes displaying and scanning forwards.

17. The gate driving circuit according to claim 11, wherein the pull-up output unit comprises: a third transistor and a storage capacitor;
a first electrode of the third transistor is connected to the clock signal input terminal, a second electrode thereof is connected to a signal output terminal, and a control electrode thereof is connected to the pull-up node; and
a first terminal of the storage capacitor is connected to the pull-up node, and a second terminal thereof is connected to the signal output terminal.

18. The gate driving circuit according to claim 11, wherein the pull-down node control unit comprises: a sixth transistor, a seventh transistor, an eighth transistor, and a ninth transistor;
a first electrode of the sixth transistor is connected to the pull-down node, a second electrode thereof is connected to the low level terminal, and a control electrode thereof is connected to the pull-up node;
a first electrode of the seventh transistor is connected to a control electrode of the eighth transistor and a second electrode of the ninth transistor, a second electrode thereof is connected to the low level terminal, and a control electrode thereof is connected to the pull-up node;
a first electrode of the eighth transistor is connected to the high level terminal, a second electrode thereof is connected to the pull-down node, and the control electrode thereof is connected to the second electrode of the ninth transistor;
a first electrode and a control electrode of the ninth transistor are both connected to the high level terminal, and the second electrode thereof is connected to the control electrode of the eighth transistor.

19. The gate driving circuit according to claim 11, wherein the noise reduction unit comprises: a fourth transistor and a tenth transistor; wherein
a first electrode of the fourth transistor is connected to the signal output terminal, a second electrode thereof is connected to the low level terminal, and a control electrode thereof is connected to the pull-down node; and
a first electrode of the tenth transistor is connected to the pull-up node, a second electrode thereof is connected to the low level terminal, and a control electrode thereof is connected to the pull-down node.

20. The gate driving circuit according to claim 11, wherein the touch scanning control unit comprises: a fifth transistor, an eleventh transistor, and a twelfth transistor; wherein
a first electrode of the fifth transistor is connected to the signal output terminal, a second electrode thereof is connected to the low level terminal, and a control electrode thereof is connected to the control signal input terminal;
a first electrode of the eleventh transistor is connected to a second electrode of the twelfth transistor, and a second electrode and a control electrode are both connected to the pull-up node; and
a first electrode and a control electrode of the twelfth transistor are both connected to the control signal input terminal, and the second electrode thereof is connected to the first electrode of the eleventh transistor.

* * * * *